(12) United States Patent
Vicary

(10) Patent No.: US 10,983,143 B2
(45) Date of Patent: Apr. 20, 2021

(54) PASSIVE SEMICONDUCTOR DEVICE ASSEMBLY TECHNOLOGY

(71) Applicant: Nu Nano Ltd, Bristol (GB)

(72) Inventor: James Vicary, Bristol (GB)

(73) Assignee: NU NANO LTD, Bristol (GB)

( * ) Notice: Subject to any disclaimer, the term of this patent is extended or adjusted under 35 U.S.C. 154(b) by 0 days.

(21) Appl. No.: 16/486,690

(22) PCT Filed: Feb. 15, 2018

(86) PCT No.: PCT/GB2018/050401
§ 371 (c)(1),
(2) Date: Aug. 16, 2019

(87) PCT Pub. No.: WO2018/150180
PCT Pub. Date: Aug. 23, 2018

(65) Prior Publication Data
US 2020/0003801 A1      Jan. 2, 2020

(30) Foreign Application Priority Data

Feb. 17, 2017 (GB) ...................................... 1702634

(51) Int. Cl.
*H01L 21/50* (2006.01)
*G01Q 60/38* (2010.01)
(Continued)

(52) U.S. Cl.
CPC ............. *G01Q 60/38* (2013.01); *G01Q 60/28* (2013.01); *H01L 21/50* (2013.01); *H01L 21/681* (2013.01); *H01L 21/6838* (2013.01)

(58) Field of Classification Search
CPC combination set(s) only.
See application file for complete search history.

(56) References Cited

U.S. PATENT DOCUMENTS

| 5,929,997 A * | 7/1999 | Lin ....................... G03F 9/7084 356/401 |
| 9,307,652 B2 | 4/2016 | Bower |
| 2014/0380532 A1 | 12/2014 | Park et al. |

FOREIGN PATENT DOCUMENTS

DE        196 22 701 A1    12/1997

OTHER PUBLICATIONS

International Search Report issued in application No. PCT/GB2018/050401.
(Continued)

*Primary Examiner* — Matthew L Reames
(74) *Attorney, Agent, or Firm* — McClure, Qualey & Rodack, LLP

(57) ABSTRACT

A method of assembling a group of devices, the method comprising the steps of: evacuating a space between each component of a first group of two or more components on a source device and a transfer device thereby to create a temporary bond between each component of the first group of two or more components and the transfer device; selectively removing the first group of two or more components from the source device whilst the transfer device is temporarily bonded to each component of the first group of two or more components on the source device; positioning the first group of two or more components on a host device; and decoupling the first group of two or more components from the transfer device, thereby to form a first group of assembled devices.

18 Claims, 11 Drawing Sheets

(51) Int. Cl.
*G01Q 60/28* (2010.01)
*H01L 21/68* (2006.01)
*H01L 21/683* (2006.01)

(56) References Cited

OTHER PUBLICATIONS

Written Opinion of the International Searching Authority issued in application No. PCT/GB2018/050401.

* cited by examiner

PASSIVE SEMICONDUCTOR DEVICE ASSEMBLY TECHNOLOGY

FIELD OF THE INVENTION

The invention relates to apparatuses and methods for assembling devices. In particular, but not exclusively, the invention relates to the assembly of semiconductor devices, such as Atomic Force Microscopy (AFM) probes.

BACKGROUND OF THE INVENTION

Semiconductor devices and micro-fabricated devices, such micro-electromechanical systems (MEMS) and sensors are now ubiquitous in every day portable electronics. Current developments in this field, to drive greater uptake, include both the addition of functionality and the reduction of the size and cost of such devices.

Semiconductor and micro-fabricated devices are typically produced by the mechanical and/or chemical processing of wafers. It is traditional semiconductor industry practice to simply shrink the size of devices in order to increase the density of devices on a wafer. The increased density of devices on a wafer maximises the use of wafer material and therefore the reduction in device size can lead to cost reductions and increased efficiency in processing.

Whilst it is known to decrease the size of devices in order to increase the number of devices produced from one wafer, the reduction in device size can compromise the structural integrity of the devices and lead to difficulties in handling and packaging the devices. Consequently, the production of smaller devices may require more complex procedures to be implemented in order to deal with the smaller devices.

An example of a procedure that is affected by the reduction in device size is the handling of devices using surface mount technologies, such as pick-and-place machines. These machines are routinely used in the semiconductor industry for high speed, high precision, assembly of electronic components onto printed circuit boards. Such machines typically consist of a moveable turret with multiple heads that can pick up a device or dispense adhesive. The pick-up mechanism is implemented using a vacuum that can be switched on to pick up the device and switched off to release the device once it is assembled onto its host substrate. However, such machines are limited in the size of components that they can handle. Whilst pick-and-place techniques are typically used to assemble semiconductor components ranging in size from a couple of hundred micrometres to several millimetres, for extremely small devices, pick-and-place cannot be used since the traditional vacuum tool cannot be machined with a sufficiently small enough aperture, e.g., less than 100 micrometres in diameter. Therefore reduction of the size of device on a wafer is limited by the subsequent procedures that the device must be subjected to.

Furthermore, the size and shape of a device imposes limitations on the speed at which any tool handling the device can operate. For example, very thin devices are more prone to breaking upon contact with a pick-and-place tool and devices only slightly larger than the pick-and-place tool are held less securely and are more likely to rotate or shear during assembly.

An alternative to using vacuum technology to handle small devices is to use an adhesive material. However, such adhesive material is necessarily removed before the device is operated. Disadvantageously, this requires further processing steps in order to apply and remove the adhesive material, which increases processing time and increases the risk of contamination of the devices.

SUMMARY OF THE INVENTION

In order to mitigate for at least some of the above described problems, there is provided a method of assembling a group of devices, the method comprising the steps of: evacuating a space between each component of a first group of two or more components on a source device and a transfer device thereby to create a temporary bond between each component of the first group of two or more components and the transfer device; selectively removing the first group of two or more components from the source device whilst the transfer device is temporarily bonded to each component of the first group of two or more components on the source device; positioning the first group of two or more components on a host device; and decoupling the first group of two or more components from the transfer device, thereby to form a first group of assembled devices.

Further, there is provided an apparatus for assembling a group of devices, the apparatus comprising: a transfer device configured to: provide an evacuated space between the transfer device and each component of a first group of two or more components on a source device with which the transfer device is contactable, thereby to create a temporary bond between each component of the first group of two or more components and the transfer device; selectively remove the first group of two or more components from the source device whilst the transfer device is temporarily bonded to each component of the first group of two or more components on the source device; position the first group of two or more components on a host device; and decouple the first group of two or more components from the transfer device, thereby to form a first group of assembled devices.

Advantageously, the method and apparatus provided avoid the need to use post-assembly processes that can contaminate devices, whilst increasing the efficiency with which different processing requirements are distributed. Beneficially, the method and apparatus can be used in combination with a range of permanent bonding mechanisms to provide fully assembled devices. Furthermore, advantageously, the apparatus can be reused without any additional or repeat processing.

Further aspects of the invention will be apparent from the description and the claims.

DETAILED DESCRIPTION OF EMBODIMENTS OF THE INVENTION

Embodiments of the invention are now described, by way of example only, with reference to the accompanying drawings, in which.

Figure 1:
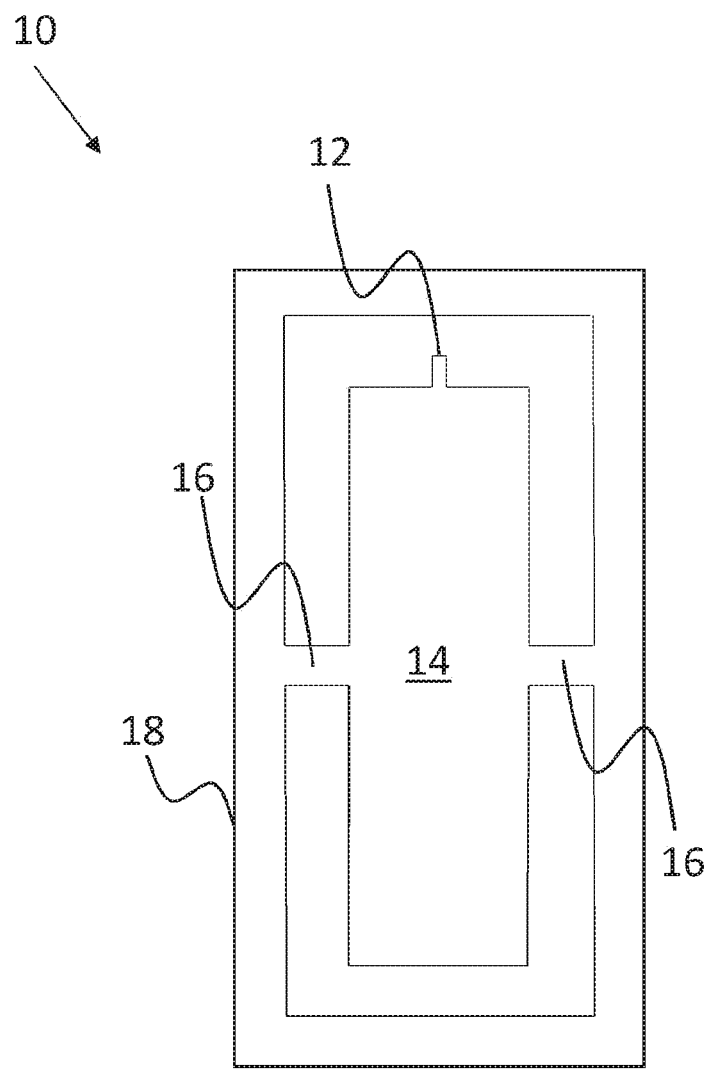
FIG. 1 is an example schematic of a prior art AFM probe.

FIG. 1 shows a prior art example of an Atomic Force Microscopy (AFM) probe 10. Known AFM probes, such as AFM probe 10, are typically manufactured from a processed wafer, such as the processed silicon wafer 20 shown at FIG. 2. The AFM probe 10 has a cantilever and tip portion 12 that protrudes from the handling portion 14. The tip of the cantilever and tip portion 12 protrudes substantially perpendicularly from the plane of cantilever (and therefore the tip is not shown in FIG. 1). In turn, the handling portion 14 is connected by attachment points 16 to a surrounding frame 18. The cantilever and tip portion 12, the handling portion 14, the attachment points 16 and the surrounding frame 18 are all fabricated from a single silicon wafer 22, such that the silicon wafer 22 provides self-supporting AFM probes that can be removed by a user for use in AFM.

Figure 2:
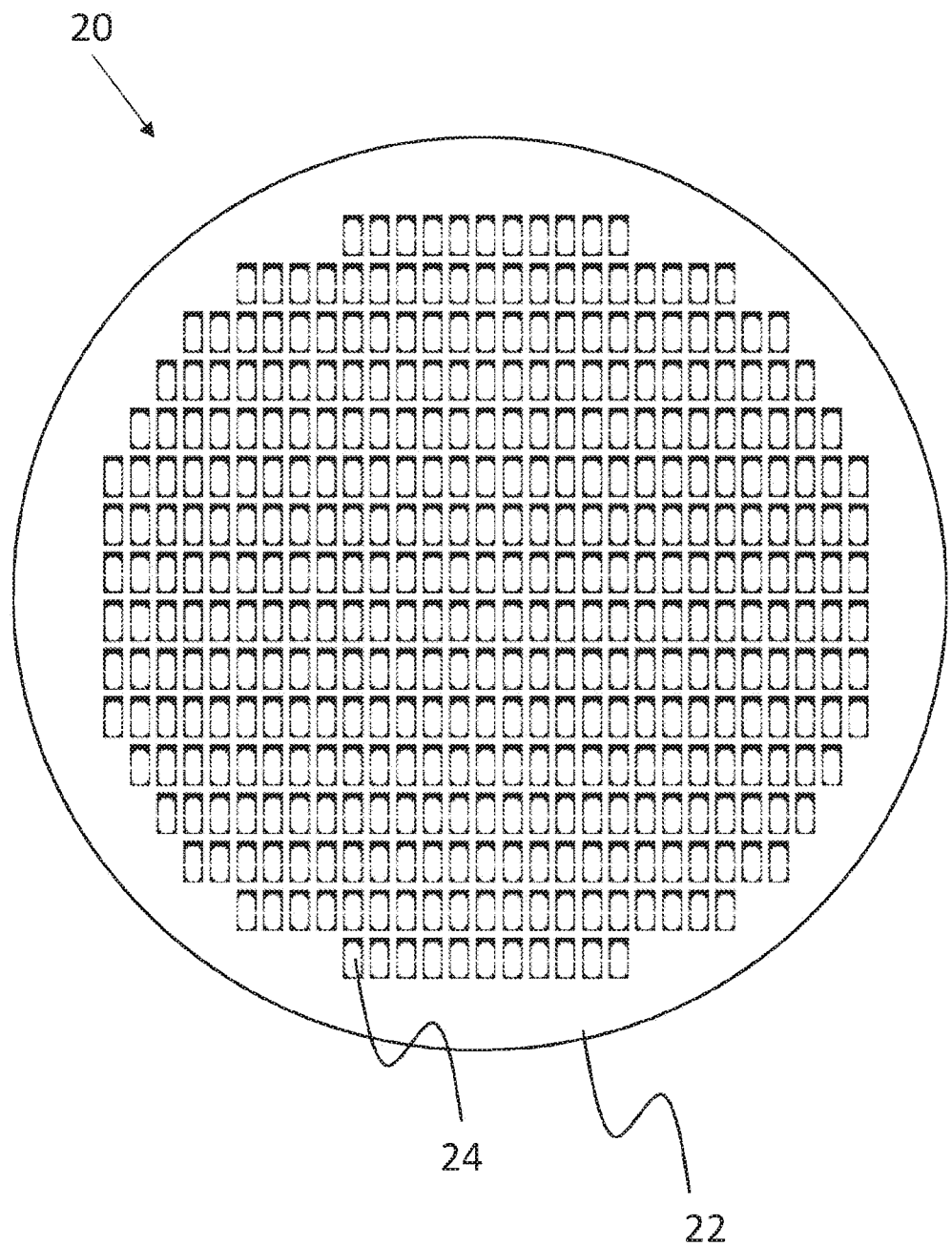
FIG. 2 is an example schematic of a processed prior art wafer containing AFM probes.

FIG. 2 shows a prior art example of a processed silicon wafer 20. A silicon wafer 22 undergoes known processes to etch an array 24 of AFM probes, thereby providing a processed silicon wafer 20, as shown at FIG. 2. The array 24 is an array 24 of AFM probes, such as the AFM probes described with reference to FIG. 1. Typically, AFM probes, such as the AFM probe 10 of FIG. 1, are fabricated from a 4-inch silicon wafer. A standard 4-inch silicon wafer typically contains approximately 400 AFM probes 10.

The most complex and important part of an AFM probe 10 is the cantilever and tip portion 12. Accordingly, it is the cantilever and tip portion 12 that requires the most intensive processing (e.g., patterning and etching steps). However, the cantilever and tip portion 12 only accounts for a small fraction of the area of an AFM probe 10 and hence a small fraction of the total area of the processed silicon wafer 20 of FIG. 2. The majority of silicon material is dedicated to the handling portion 14 of the AFM probe 10. The handling portion 14 of the AFM probe 10 does not require significant processing itself, but makes up a significant portion of the silicon wafer 22 that undergoes intensive processing in order to fabricate the cantilever and tip portion 12 of an AFM probe 10.

In order to overcome the inherent restriction imposed by the requirement for an AFM probe to have a sufficiently sized handling portion 14 so that a user can handle the AFM probe, the cantilever and tip 12 portion of the AFM probe 10 can be decoupled from the handling portion 14. Advantageously, a higher density of the complex cantilever and tip portions 12 of the AFM probes 10 can be processed on a single wafer whilst the handling portion 14 is fabricated separately without undergoing unnecessary processing.

Figure 3A:
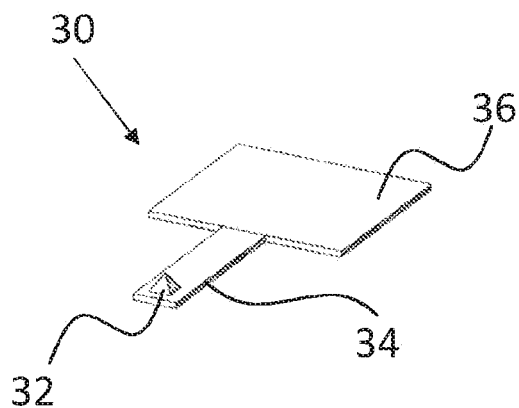
FIG. 3A is a perspective view of an AFM tip and cantilever construction.

FIG. 3A shows a perspective view of an AFM cantilever and tip construction 30. This is the complex component 30 of an AFM probe. There is shown a cantilever 34 protruding from a bonding pad 36 and a tip 32 protruding substantially orthogonally from the plane of the AFM cantilever 34. The AFM cantilever and tip construction 30 is a component 30 that can be fabricated with a high-density from a silicon wafer without the need to use large amounts of space for a handling portion.

Figure 7:
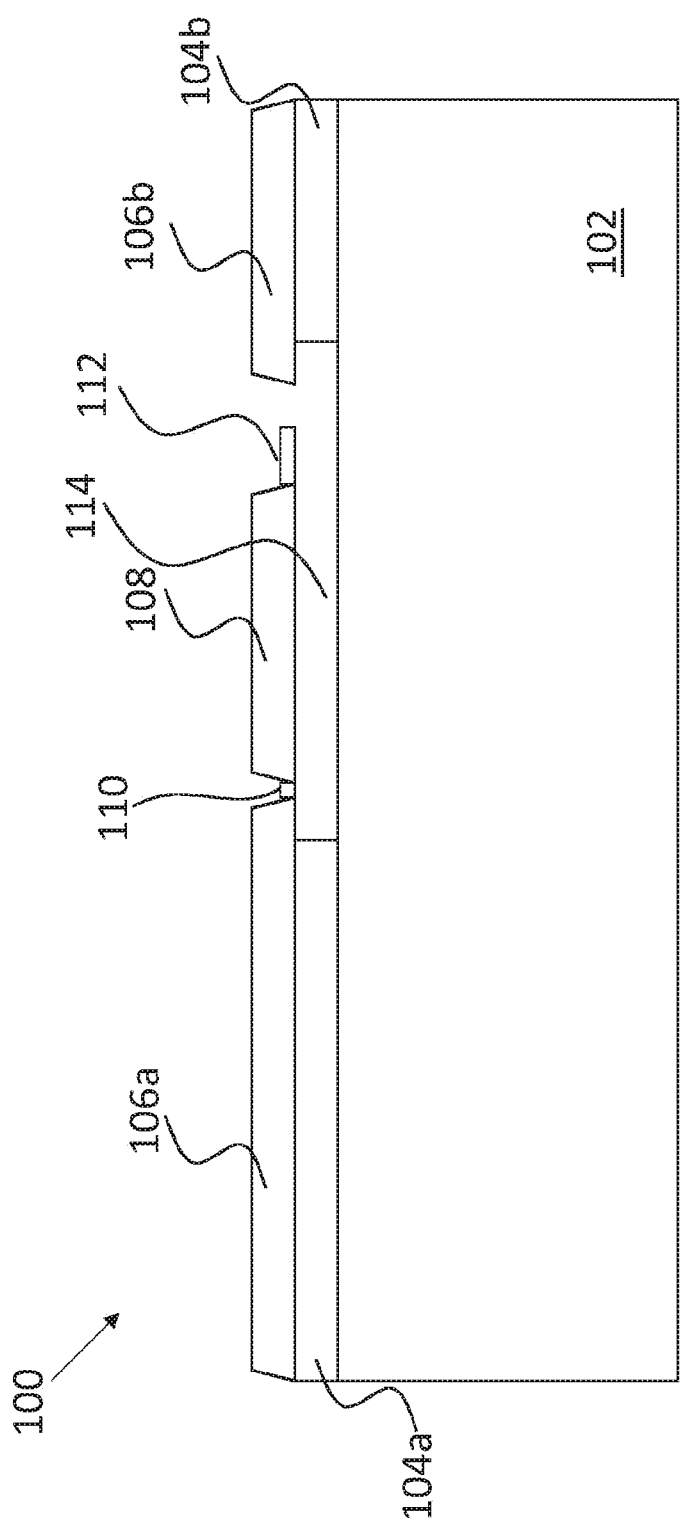
FIG. 7 is a cross-sectional drawing of a source device.

Whilst the bonding pad 36 is shown to be a distinct part of the AFM cantilever and tip construction 30, alternatively, the bonding pad 36 is not distinct from the cantilever 34 and is a portion of the cantilever that is bondable to a handling chip. The bonding pad 36 may take any appropriate form. The bonding pad 36, as described below with reference to FIG. 7, is typically formed from a thin layer of silicon (e.g., 20 μm or less) and therefore is significantly thinner than the traditional handling portion 14 of the prior art. This means that prior art techniques for manipulating components such as handling portions 14 of prior art AFM probes 10 are not suitable for manipulating bonding pads 36.

Figure 3B:
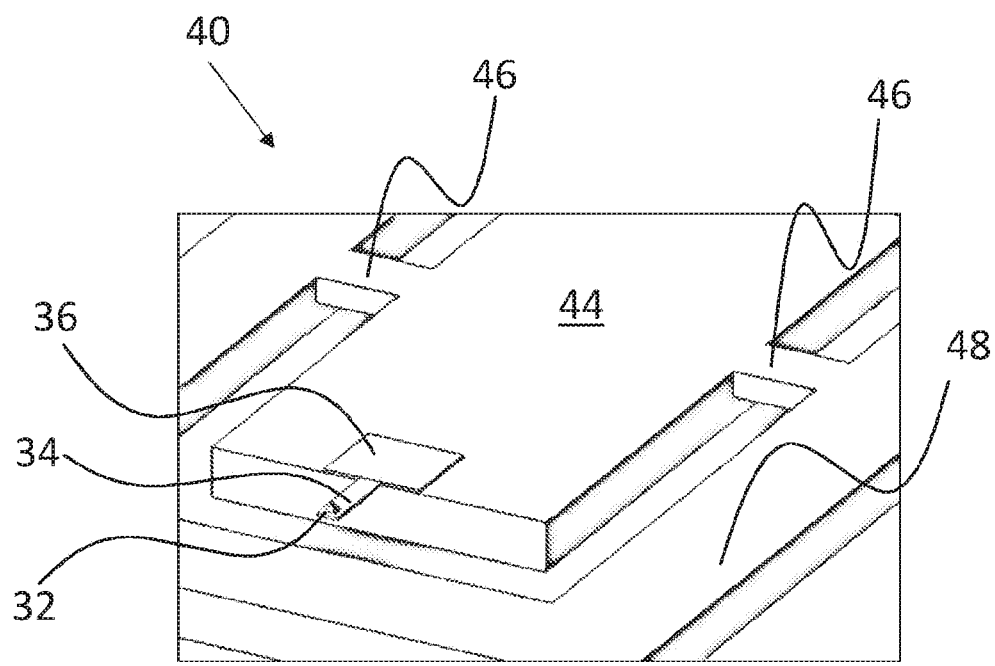
FIG. 3B is a perspective view of an AFM probe in accordance with the invention.

The AFM cantilever and tip construction 30 is bonded to a handling chip 44 in order to provide an assembled AFM probe 40. FIG. 3B shows an AFM probe 40 that is constructed from a component 30 that is an AFM cantilever and tip construction 30 and a handling chip 44. The handling chip 44 is fabricated from a wafer and provided with attachment points 46 that connect the handling chip 44 to a frame 48 of a wafer. Advantageously, the handling chip 44 is constructed without the intensive processing steps that are required to fabricate the AFM cantilever 34 and AFM tip 32. Therefore, the handling chips 44 can be fabricated separately from the AFM cantilever and tip construction 30. The handling chips 44 are significantly thicker than the bonding pad 36 and provide the rigidity and robustness required to manipulate the AFM probe 40 with known techniques.

Whilst a single AFM cantilever and tip construction 30 is shown to be bonded to a handling chip 44 in order to provide an assembled AFM probe 40, alternatively any number of AFM cantilever an tip constructions 30 can be bonded to a handling chip 44 to provide a multi-cantilever and tip AFM probe. Further, an assembly of multiple AFM cantilever and tip constructions 30, formed from a single wafer with a single bonding pad 36, may be bonded to a handling chip 44 in order to provide a multi-cantilever and tip AFM probe.

The AFM cantilever and tip construction 30 is formed from silicon. However, alternatively, the AFM and tip construction 30 is formed from silicon nitride or silicon dioxide, or other appropriate material. Optionally, the AFM cantilever and tip construction 30 has one or more coatings in order to provide improved or tailored response properties. Further, optionally, the AFM cantilever and tip construction 30 can be formed from any combination of appropriate materials, such as the combination of a silicon tip on a silicon nitride cantilever.

Whilst FIGS. 3A and 3B show the assembly of an AFM probe 40 from a complex cantilever and tip construction 30, bonding pad 36 and cantilever portion 44, the high density production of complex parts of devices to be combined with host portions is envisaged for other devices.

Beneficially, where a device, such as an AFM probe 10, has different subsections that vary in fabrication complexity and process requirements, decoupling the fabrication of the complex part of the device from fabrication of the rest of the device by fabricating the complex part of the device on a separate wafer from the less complex part of the device means that the efficiency of processes to assembly multi-component devices can be improved, thereby reducing material wastage and reducing costs.

Whilst there are significant advantages to assembling devices from components that have been fabricated separately in order to separate more complex fabrication from less complex fabrication, further efficiencies can be introduced, dependent on the method that is used to assemble the multi-component device.

Figure 4:
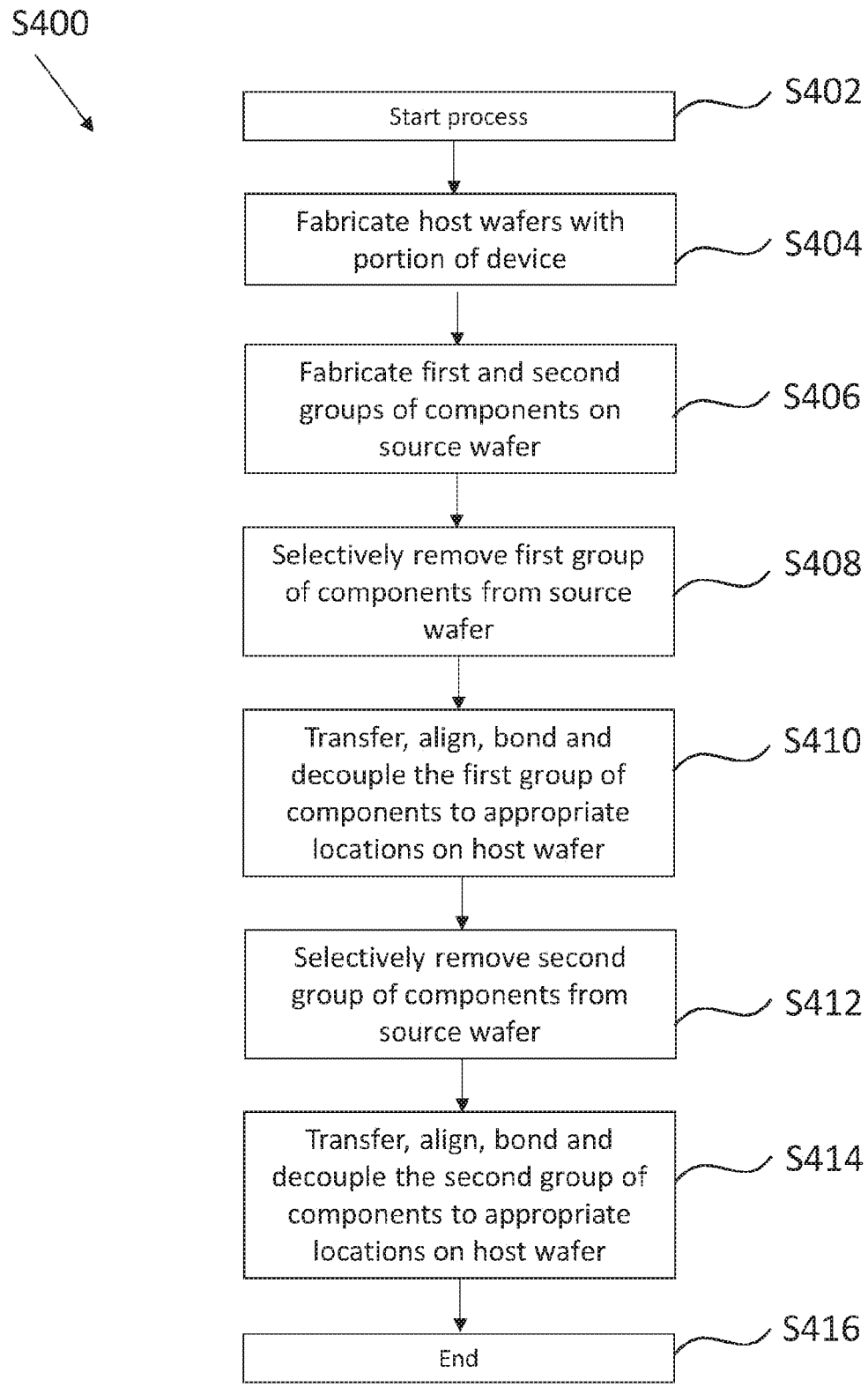
FIG. 4 is a flow diagram of a method of assembling devices, in accordance with the invention.

FIG. 4 is a flow diagram of a method for assembling AFM probes, such as the AFM probe 40 of FIG. 3B.

The process starts at step S402, where the method for assembling AFM probes having multiple components is initiated. The process is initiated with the preparation of the materials, which will subsequently be dealt with in a suitable tool that provides alignment means. An example of suitable apparatus is a wafer bonding tool.

Once initiated, the process moves to step S404. At step S404, host wafers are prepared with portions of a device that, when combined with complex portions of a device, form a fully assembled device. The host wafers are fabricated with a plurality of handling chips, such as the handling chips 44, as described with reference to FIG. 3B. The handling chips 44 form the base of the AFM probes 40. The handling chips 44 require less processing than the AFM cantilevers and tip construction 30 and can be straightforwardly manufactured. The size and density of the handling chips 44 on a host wafer is similar to the size and distribution of the AFM probes 10 in the prior art, as described with reference to FIGS. 1 and 2. However, none of the complex processing required to produce the AFM cantilevers and tip constructions 30 is required.

Once the host wafers have been fabricated, the process moves to step S406. At step S406 a wafer of high density components 30 is fabricated. The components 30 are fabricated in an array, where each component is an AFM cantilever with AFM tip, such as the AFM cantilever and tip assembly 30 described in respect of FIG. 3A. The array is fabricated from a source wafer using techniques and processes known in the art. Due to the lack of restrictions imposed in the prior art of having a handling portion 14 as an integral part of an AFM probe 10, the array of components 30 can be made with a much higher density than the density of AFM probes 10 in the array 24 of the prior art of FIGS. 1 and 2. The arrangement of high density components is described in more detail below, with reference to FIGS. 5A to 6B.

Once the high density, complex processing to fabricate the source wafers has been completed at step S406, the process moves to step S408, where the components 30 are selectively removed from the source wafer using a transfer device. The use of a transfer device is described in greater detail with reference to FIGS. 7 to 11B, below. The selective removal of the components from the source wafer using the transfer device takes place in a suitable tool, which may be a wafer bonding tool. The tool provides the means to align the transfer device with the source wafer in order to extract the components 30. The tool also provides the means to create a pressure differential that is used to extract the components 30. This is described in more detail below, with reference to FIGS. 7 to 11B.

The process then moves to step S410 where the selectively removed components 30 are transferred from the source wafer and are positioned on the host wafer using the transfer device. The positioning of removed components 30 is performed with alignment means, such as the alignment means provided in a wafer bonding tool. The components are then bonded to the host device and subsequently decoupled from the transfer device.

The process then moves to step S412, where a second group of components is selectively removed from the source wafer using the transfer device. The selective removal of a second group of components from the source wafer is performed in the same manner as the removal of the first group of components. The process then moves to step S414, where the second group of components are transferred from the source wafer and positioned on a host wafer using the transfer device, in the same manner that the first group of components is transferred positioned on a host wafer. The second group of components are then bonded to the host device and subsequently decoupled from the transfer device. The process of selectively removing components from the source device and transferring them to a host device is repeated as many times as is necessary before the process finishes at step S416.

Whilst the process S400 has been described in a particular order, alternatively the fabrication of the host wafers and source wafers can be performed in any order. Further, whilst the process is described in respect of the sequential removal of groups of components from a single source wafer, alternatively, the process may involve the removal of only one group of components from a source wafer. Alternatively, the process may involve the sequential or parallel removal of different groups of components from multiple source wafers and the positioning and decoupling of those groups of components on one or more host wafers, thereby to form assembled devices with one or more different types of components integrated onto a host portion (for example, to produce single or multiple cantilever and tip AFM probes).

Advantageously, by simultaneously selectively extracting many components (e.g., components 30) from a source wafer and bonding them simultaneously to portions of a host wafer that have been prefabricated (e.g., handling chips 44), the efficiency of device (e.g., AFM probe 40) fabrication is increased.

Beneficially, the location of the components in the high density source wafer mirrors the distribution of positions of the remainder of the devices on the host wafers (the remainder of the devices being the portion of the device with which a component is combined to form an assembled device). However, rather than there being a one to one relationship between components on the source wafer and the remainders of the pre-assembled devices on a host wafer, the array of components on the source wafer is offset and repeated numerous times in order to increase the ratio of components on the source wafer to remainders of devices on host wafers.

In the prior art, such as that shown in FIG. 2, there may be 400 probes on a 4 inch wafer. If there are 400 remainders of devices (for example, 400 handling chips 44) on a host wafer and the density of cantilever and tip components 30 is increased by 12 times (i.e. the area occupied by 12 AFM cantilever and tip components 30 (and optionally, bonding pad 36) is the same as one AFM probe 10 seen in the array 24 of the prior art), then the 12 fold increase in cantilever and tip components 30 requires a 12 fold increase in the number of handling chips 44 and hence host wafers. To efficiently distribute the cantilever and tip components 30 (which preferably include a bonding pad 36), the process simultaneously selectively removes 400 cantilever and tip components 30 and positions them at the appropriate locations on a host wafer to facilitate the assembly of AFM probes 40. The process can then use the same transfer mechanism to selectively remove the next 400 cantilever and tip components 30 and position them on a second host wafer. The process is repeated 12 times.

Figure 5A:
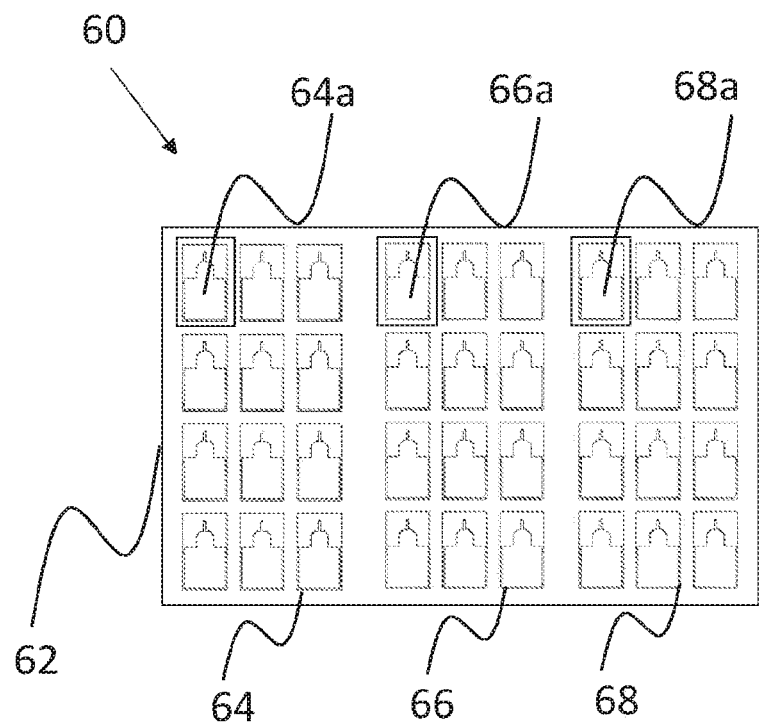
FIG. 5A is a schematic of an array of AFM components.

This distribution of components of devices is illustrated with reference to FIGS. 5A and 5B. FIG. 5A shows an array 60 of AFM components (such as the components 30 described with reference to FIGS. 3A and 3B). The array 60 is distributed across a source device 62, which has 36 components. The array 60 of components shows components that are fabricated from a source device, which is wafer, with a higher density than the AFM probe density typically seen in the prior art, as each component has a bonding pad 36, but no handling portion (such as the handling portion 14 described with reference to FIG. 1). The source device 62 is shown to be divided into three sections 64, 66, 68. Each section 64, 66, 68 corresponds to an area of the source device 62 that would ordinarily be attributed to an entire AFM probe 10 including a handling portion 14. In the example of FIGS. 5A to 6B, AFM cantilever and tip components (such as AFM cantilever and tip components 30, described with respect to FIGS. 3A and 3B) are fabricated with a 12 fold increase in density. Accordingly, there are 12 components in each of the sections 64, 66, 68. The first component 64a of section 64 is highlighted. The first component 66a of section 66 is highlighted and the first component 68a of section 68 is highlighted. The components 64a, 66a and 68a form a first group.

Alternatively, any number of components, or any distribution of components can be used to form a group.

Figure 6A:
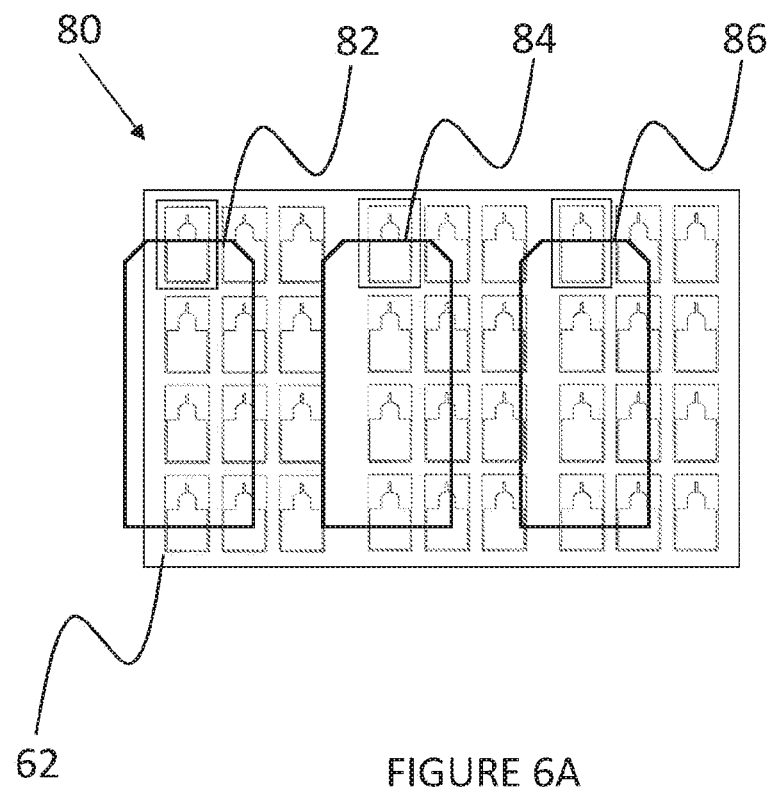
FIG. 6A is a schematic of the array of AFM components of FIG. 5A showing the relative position of a first group of components on a host device.

The distribution of the components 64a, 66a, 68a on the source wafer 62 is the same, corresponding distribution as provided for the three remainders of the three devices on a host wafer, to which they are bonded to form complete, assembled, AFM probes. This is shown with respect to FIG. 6A. In FIG. 6A, the position of the handling chip (such as handling chip 44) for each AFM probe that can be built from the first group of components of the source wafer 62 is shown. Accordingly, the handling portion 82 (which is shown as an outline, for ease of reference) is combined with the component 64a to form an assembled device by bonding the component 64a to the handling portion 82. The handling portion 84 is combined with component 66a to form an assembled device by bonding the component 66a to the handling portion 84 (which is shown as an outline, for ease of reference). The handling portion 86 is combined with component 68a to form an assembled device by bonding the component 68a to the handling portion 86 (which is shown as an outline, for ease of reference).

Due to the configuration of components in the sections 64, 66, 68 of the source wafer 62, a transfer device that is used to selectively remove the first group 64a, 66a, 68a of components from the source device 62 can be used to remove a second group of equally spaced components and position them in the same relatively corresponding positions on a host wafer. This is shown with reference to FIGS. 5B and 6B.

Figure 5B:
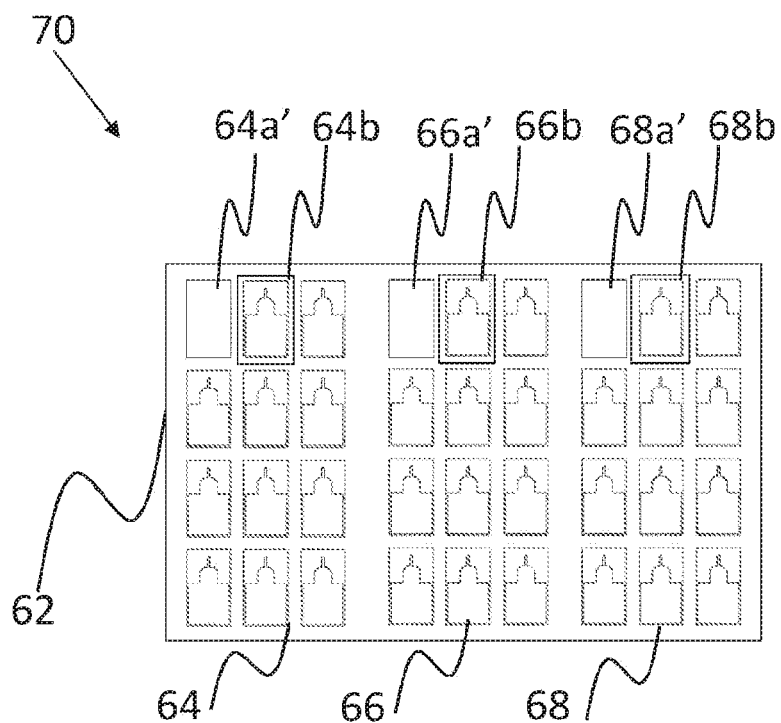
FIG. 5B is a schematic of the array of AFM components of FIG. 5B with a group of components removed.

FIG. 5B shows an array 70 of components of the source device 62. However, the first group of components 64a, 66a, 68a of the sections 64, 66, 68 have been removed, leaving spaces 64a', 66a', 68a'. The second component 64b of section 64 is highlighted. The second component 66b of section 66 is highlighted and the second component 68b of section 68 is highlighted. The components 64b, 66b and 68b form a second group.

Figure 6B:
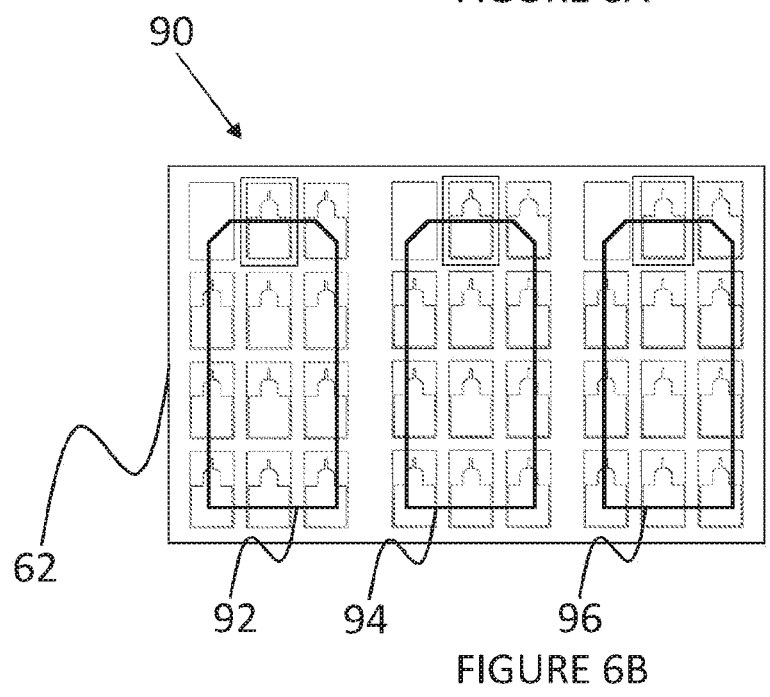
FIG. 6B is a schematic of the array of AFM components of FIG. 5B showing the relative position of a second group of components on a host device.

The distribution of the components 64b, 66b, 68b on the source wafer 62 is the same distribution as the remainder of the three devices to which they correspond on a host wafer. This is shown with respect to FIG. 6B. In FIG. 6B, the position of the handling portion (such as handling chip 44) for each AFM probe that can be built from the first group of components of the source wafer 62 is shown. Accordingly, the handling portion 92 (which is shown as an outline, for ease of reference) is combined with the component 64b to form an assembled device by bonding the component 64b to the handling portion 92. The handling portion 94 (which is shown as an outline, for ease of reference) is combined with component 66b to form an assembled device by bonding the component 66b to the handling portion 94. The handling portion 96 (which is shown as an outline, for ease of reference) is combined with component 68b to form an assembled device by bonding the component 68b to the handling portion 98.

The relative positional correspondence between the handling chips 82, 84, 86 of a first host wafer and the handling chips 92, 94, 96 of a second host wafer means that a transfer device that is used to selectively remove the first group of components 64a, 66a, 68a can also be used to selectively remove the second group of components 64b, 66b, 68b. The process can be repeated in order to sequentially remove all of the components of the source device 62. Therefore, in the example of FIGS. 5A to 6B, 12 host wafers are required to provide handling chips to accommodate the components from the source device 62.

Whilst FIGS. 5A to 6B depict source devices with 36 components, alternatively source devices of any size, shape and density of components may be used in order to effect the benefits described herein. Further, alternatively, assembled devices can be formed by extracting groups of components from one or more source devices and transferring them to one or more host devices.

Accordingly, if standard AFM probes are fabricated with N probes per wafer, the final host wafer will contain N prefabricated handling chips. If the density of the process-intensive elements of the probe devices is increased D times, then N×D process-intensive elements of the devices can be fabricated on each source wafer (4800 in the example above, where D=12 and N=400). The selective extraction and bonding of the composite probe devices therefore need to be performed D times to distribute N probes onto D host wafers. This efficiency in scaling can be applied to other devices in other arrangements.

Whilst wafers are typically used as a starting point for the fabrication of components, other devices can be used as a starting point for the fabrication of components. Similarly, whilst wafers are typically used as the host for receiving the complex components from a source device, other devices can be used.

In order to selectively remove components from a source wafer and transfer them to a host wafer, a transfer device is required. A way of selectively removing and transferring components from a source wafer to a host wafer is shown with respect to FIGS. 7 to 9.

FIG. 7 shows a cross-sectional view of a source wafer 100. The source wafer 100 is processed in order to provide an AFM cantilever and tip construction (such as component 30) that can be selectively removed from the source wafer 100 and transferred to a host wafer. The source wafer 100 has a first layer 102, which is silicon, a second layer 104a, 104b which is silicon dioxide and a third layer 106a, 106b, 108, 110, 112, which is silicon. In an example, the first layer 102 is 300 μm thick, the second layer 104 is 2 μm thick and the third layer 106 is 15 or 20 μm thick). The three layer wafer 100 is produced using known techniques such that a bonding pad 108 is formed with a cantilever and tip 112 protruding from the bonding pad 108 (whereby the bonding pad 108, and cantilever and tip 112 form a component, such as component 30 described with reference to FIGS. 3A and 3B). The silicon oxide layer 104*a*, 104*b* is etched in order to provide a cavity 114 underneath the bonding pad 108 and the cantilever and tip 112. The bonding pad 108 is attached at an attachment point 110 to the silicon layer 106*a*.

The result is that a cantilever and tip 112 component is suspended from a frame the source wafer 100 at the attachment point 110. The attachment point 110 holds the component in place when part of the source wafer 100, but can be broken in order to remove the component from the source wafer 100. Advantageously, the attachment points 110 are formed in the same process as the cantilever 112, thereby reducing processing requirements. This results in the attachment points 110 typically being of the same thickness as the cantilevers 112.

Whilst one attachment point 110 is shown, there may be any number of attachment points 110. Further, whilst there is shown a cavity 114 between the bonding pad 108 and the layer 102, alternatively, the layer 102 is etched such that the cavity 114 extends through the layer 102. Furthermore, whilst FIG. 7 illustrates one suspended component of a device (formed from bonding pad 108 and cantilever and tip 112), a source wafer 100 may contain many components, configured in repeated in patterns as described above with reference to FIGS. 5A to 6B.

Figure 8:
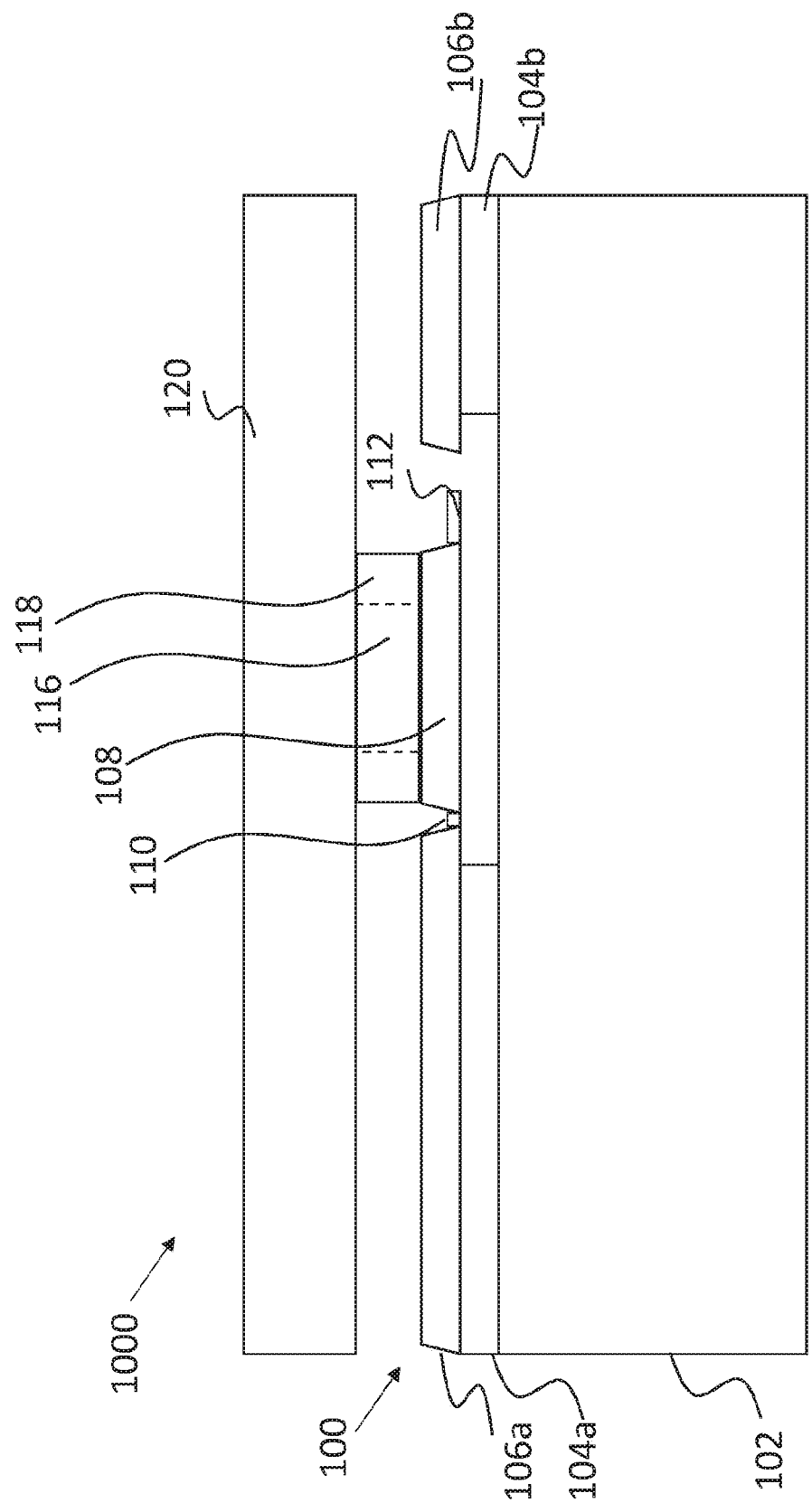
FIG. 8 is a cross-sectional drawing of a source device and a transfer device as a temporary bond is created.

Each suspended component of a device of a source wafer must be selectively removed from the source wafer. This is done using a transfer device in a vacuum chamber. FIG. 8 shows a combination 1000 of the source wafer 100 in contact with a transfer device 120. The transfer device 120 has multiple structures 118 that marry up with the components that are to be extracted from the source wafer 100. The transfer device 120 has a feature 118 protruding from the underside of the transfer device 120. The feature 118 has a void 116. When the feature 118 is brought into contact with the bonding pad 108 of the source wafer 100, the periphery of the feature 118 forms a seal on the surface of the bonding pad 108, effectively to seal the void 116 and to create a sealed cavity. The feature 118 of the transfer device 120 is brought into contact with the bonding pad 108 in an evacuated chamber. The pressure in the chamber may be of the order of $7 \times 10^{-5}$ mbar, and is preferably less than or equal to $10^{-4}$ mbar. An example of an evacuated chamber is a wafer bonding tool. The evacuated chamber has alignment means to ensure that the features of the transfer device 120 align with the components of the source wafer 100 that are to be extracted. Therefore the transfer device 120 has at least one or more optically transparent regions to enable such alignment. The optically transparent regions may be formed through the use of an optically transparent material, e.g., glass, being used to form the transfer device 120, or through the use of another material that facilitates optical alignment. In further examples, the transfer device 120 may comprise one or more holes that act as viewing ports. Such holes are optionally formed by etching the transfer device 120 using physical or chemical means.

Whilst the transfer device 120 is preferably optically aligned, in alternative examples, other alignment methods that provide the necessary accuracy of alignment can be used.

Once contact has been made between the feature 118 and the bonding pad 108, the chamber is vented to atmospheric pressure, thereby creating a pressure differential between the void 116 of the transfer device 120 and the bonding pad 108 of the component 108, 112 of the source wafer 100. This results in a non-adhesive, temporary, bond between the transfer device 120 and the source wafer 100.

Figure 9:
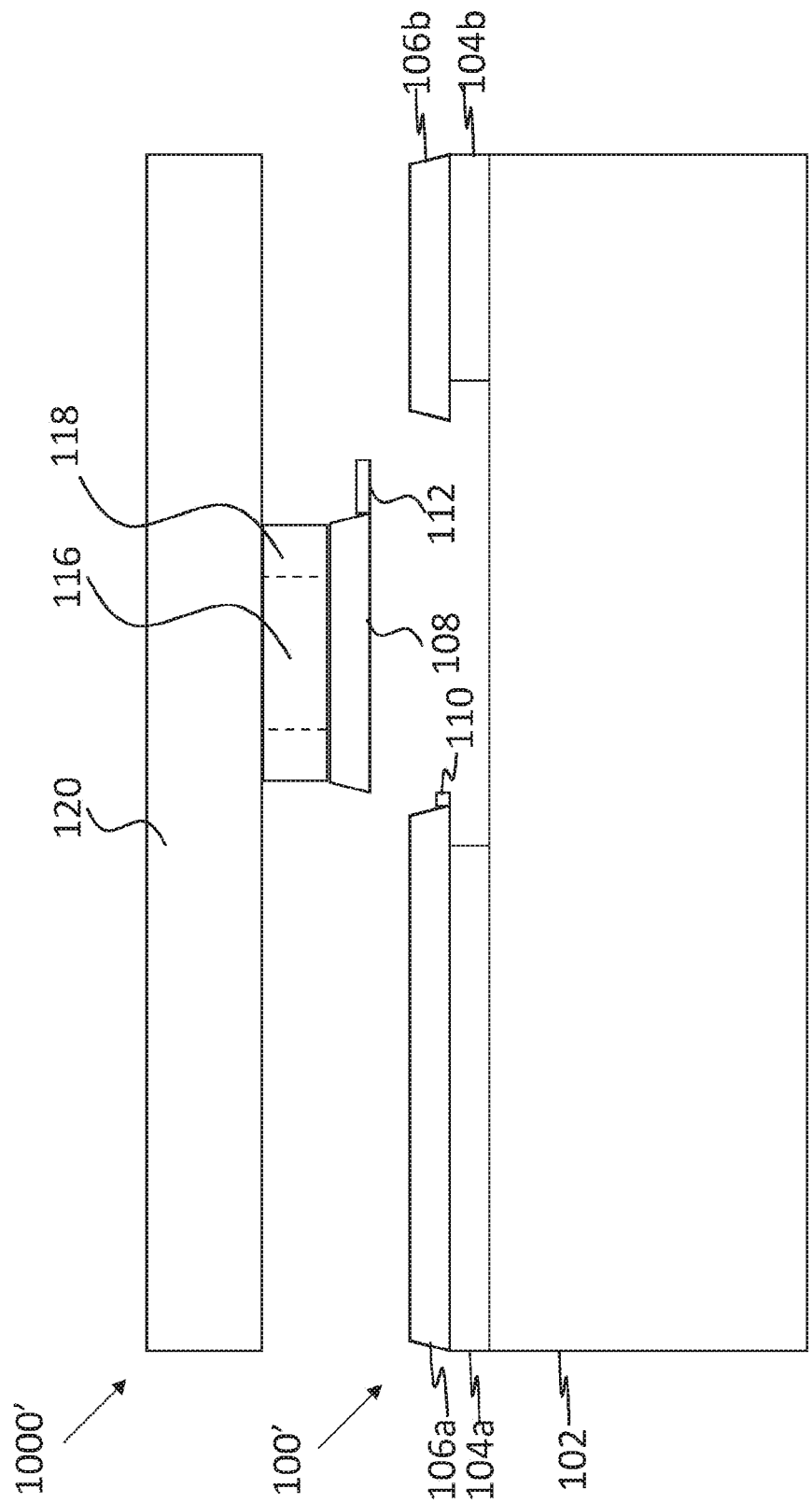
FIG. 9 is a cross-sectional drawing of the selective removal of a component from the source device by the transfer device.

When the transfer device 120 is separated from the source wafer 100 using the means for aligning the transfer device, for example the alignment means of a wafer bonding tool, the force created by the temporary bond formed by the pressure differential created between the void 116 and the surrounding chamber, is sufficient to overcome the force retaining the bonding pad 108 to the layer 106*a* of the source wafer 100 at the attachment point 110. The attachment point 110 breaks and the bonding pad 108 and cantilever and tip 112 are selectively removed from the source wafer 100. This is illustrated in FIG. 9 where the transfer device 120 is at a second position 1000' and the component of the device (the bonding pad 108, cantilever and tip 112) are no longer attached to the source wafer 100'. The component is then transferred, using the transfer device 120, to a host wafer. The component is positioned using the same alignment means that facilitated the extraction of components from the source wafer, in place on the host wafer at atmospheric pressure. The component is then permanently bonded to the handling portion of a host wafer. Then the transfer device 120 and the component are decoupled. The decoupling of the transfer device 120 is performed by evacuating the vacuum chamber to the same, or lower pressure that was used to form the temporary bond. The component then detaches from the transfer device 120 and the component and the transfer device 120 are separated. The transfer device 120 is reused to repeat the transfer of components from the source wafer to host wafers in the manner described above.

Alignment of source, transfer and host wafers may be performed by any suitable means. For example, a wafer bonding tool may be used to align the wafers. As described above, the transfer device 120 preferably comprises a region that is sufficiently optically transparent to enable accurate alignment of the source 100 and transfer 120 and transfer 120 and host devices, respectively, so that groups of devices can be simultaneously assembled.

Whilst the transfer device 120 of FIGS. 7 to 9 is shown to have one feature 118, alternatively, the transfer device 120 can have any number of features 118. Further, the features 118 can be arranged in any suitable configuration or pattern to selectively remove components from a source wafer and transfer them to a host wafer. Further, the configuration of features 118 can replicate a repeated configuration of multiple groups of components on a source wafer, so that they may be distributed to multiple, identical, host wafers. The features 118 and cavities 116 may have any suitable shape and relative size that is sufficient to selectively extract components from a source wafer and transfer them to a host wafer. For example, the depth/height of the transfer device 120 features 118 and cavities 116 may be chosen to provide clearance between wafers when extracting and then bonding between wafers with planar top surfaces (e.g., 20 µm). Alternatively, the depth/height of the features 118 and cavities may be chosen to extend, e.g., greater than 100 µm so that the devices can be assembled onto a recess below the top surface of a host wafer.

The transfer wafer 120 is an etched wafer (which may be a silicon wafer, or a glass wafer) that is suitably patterned and etched to provide features 118 and cavities 116, from the bulk wafer, that are suitable for selectively removing and transferring components from a source device to a host device. However, alternatively, the features 118 and cavities 116 can be provided on the surface of the transfer device by patterning a surface of a wafer, for example a polymer surface. The use of polymer structures may improve the mechanism for selectively removing components from source wafers and transferring them to host wafers since they provide improved conformability to create a peripheral seal around the void 116 that is used to create a pressure differential are provided. For example, if the surface of the device has contaminants, a polymer structure fabricated from the same bulk material as the transfer device 120 may encompass the contaminants and still maintain the necessary seal. Alternatively, a polymer coating can be used over the structures of a transfer device 120. Examples of polymers that may be used in conjunction with the transfer device 120 include, but are not limited to: photoresists such as SU-8, Polydimethylsiloxane (PDMS), parylene, etc.

In an example, the force with which a 500 μm×500 μm device is attached to a cavity with a diameter of 300 μm, the force keeping the device attached to the transfer device is of the order of 0.01 N (c.f., force of gravity acting on the device of $1*10-7$ N).

Whilst a particular implementation of a method of trapping a vacuum using voids of a transfer device that are completely enclosed when in appropriate contact with components that can be moved from a source device to a transfer device is described above, other implementations that achieve the same effect by using a passive, trapped vacuum, are envisaged. Such methods involve evacuating a space between a transfer device and a component, such that a pressure differential is provided, where the pressure differential provides a sufficient force to 'stick' the component to the transfer device without the need for adhesive.

As described above, in order to selectively remove components from a source wafer and transfer them to a host wafer, a transfer device is required. A way of selectively removing and transferring components from a source wafer to a host wafer is shown with respect to FIGS. 10A to 11B.

Figure 10A:
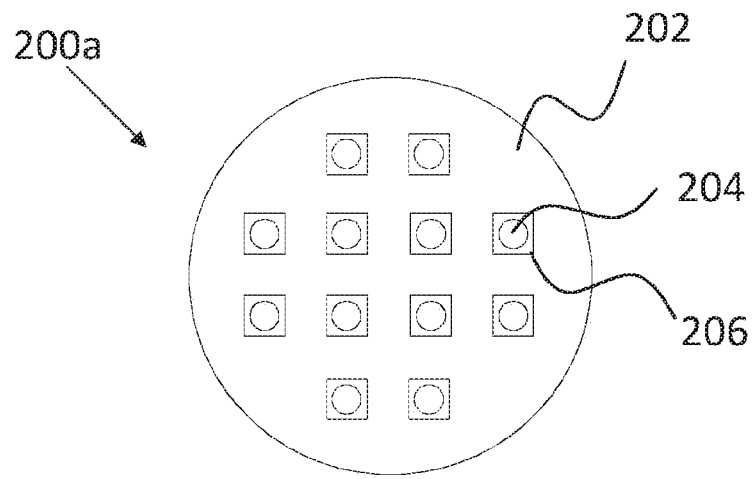
FIG. 10A is a plan view of the bottom of a transfer device.

FIG. 10A shows an example of a plan view of a transfer device 200a. The transfer device 200a is a wafer 202 that has a series of features 206 with holes 204 designed to address components of devices. Whilst 12 features 206 and 12 holes 204 are shown in FIG. 10A, the transfer device 200a may alternatively comprise any number of features 206 and holes 204 in any necessary combination and configuration that is required to extract components form source devices and transfer them to host devices.

Figure 10B:
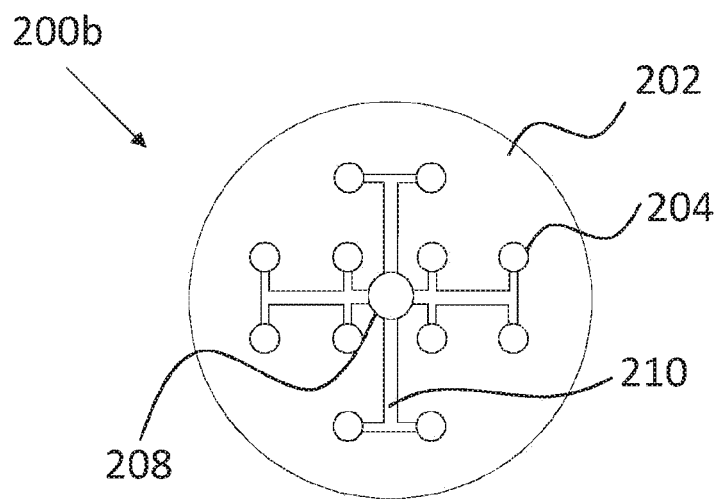
FIG. 10B is a plan view of the top of the transfer device of FIG. 10A.

The wafer 202 is a glass or silicon wafer that is processed using micro-fabrication techniques to provide a transfer device 202 with holes 204 and features 206 that enable components of a multi-component device, such as an AFM probe, to be transferred from a source wafer to a host wafer. The rear plan view 200b of the transfer device 200a is shown at FIG. 10B. FIG. 10B shows holes 204 that are in communication with a channel structure 210 that is used to connect to a vacuum source at central communication point 208, thereby to create a pressure differential between the interior of the transfer device holes 204 and the surface. The pressure differential enables components of devices to be transferred from a source wafer to a host wafer by creating a temporary bond between the component and the transfer device 200b.

Figure 11A:
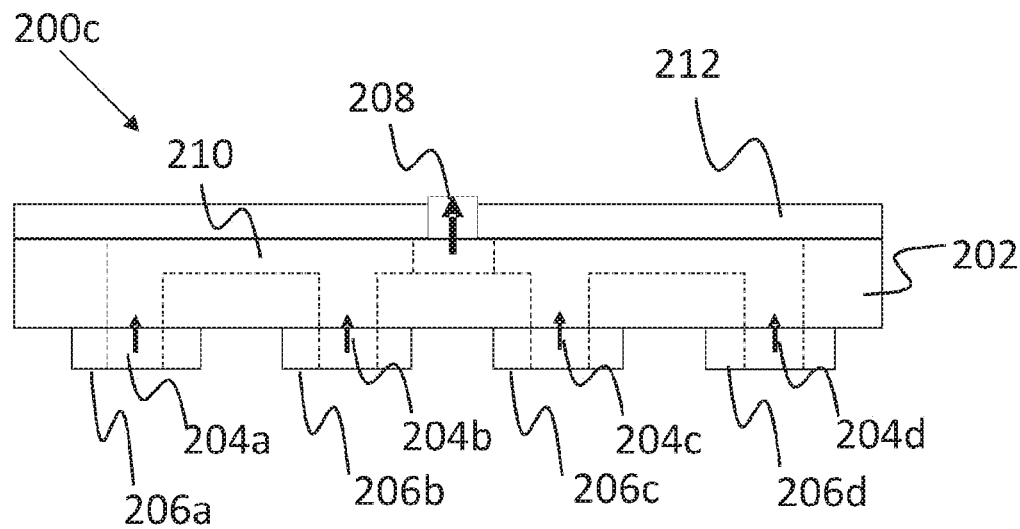
FIG. 11A is a cross-sectional view of a transfer device of FIGS. 10A and 10B.

FIG. 11A shows a cross-sectional view 200c of the transfer device 200a, 200b. There is shown at FIG. 11A a layer 212, which may form part of a vacuum apparatus (for example part of a wafer bonding tool) or, alternatively, forms an integral part of the transfer device 200c. The layer 212 acts in combination with the transfer wafer 202 to form an enclosed channel structure that can be evacuated thereby to create a pressure differential suitable for transferring components from a source device to a host device. The enclosed channel structure is continuously pumped with a vacuum pump in order to evacuate the channel structure and form the pressure differential that is necessary to extract the components from a source wafer and transfer them to a host wafer.

FIG. 11A shows four features 206a, 206b, 206c, 206d with holes 204a, 204b, 204c, 204d etched through the features, respectively. The holes 204a, 204b, 204c, 204d are etched from the wafer 202 using chemical and/or physical etching means. Whilst features 206a, 206b, 206c, 206d are shown, alternatively, the transfer device 200a does not include the features 206a, 206b, 206c, 206d and the entrance to the holes 204a, 204b, 204c, 204d are flush with the underside of the wafer 202, which underside is used to contact, extract, transfer and deposit components from a source wafer to a host wafer. The holes 204a, 204b, 204c, 204d are etched such that they are in fluid communication with a central channel or channel structure 210.

The transfer device 200 is constructed from two parts 212, 202, which are brought together to form a final transfer device 200, as shown with respect to FIGS. 10A to 11B. However, in further examples, the transfer device is formed from a single, micro-fabricated wafer. In further examples, the transfer device is formed with open channels that are closed when the transfer device is brought into contact with a vacuum chuck, such that the vacuum chuck provides the effect of the layer 212 of FIGS. 11A and 11B.

Each suspended component of a device of a source wafer must be selectively removed from the source wafer. The transfer device 200c has multiple features 206a, 206b, 206c, 206d with holes 204a, 204b, 204c, 204d that marry up with the components that are to be extracted from the source wafer 100a. The transfer device wafer 202 has features 206a, 206b, 206c, 206d with holes 204a, 204b, 204c, 204d protruding from the underside of the transfer device wafer 202. The apparatus used for assembling devices has alignment means to ensure that the features 206a, 206b, 206c, 206d with holes 204a, 204b, 204c, 204d of the transfer device 200c align with the components of the source wafer, such as source wafer 100 described with reference to FIGS. 7 to 9, that are to be extracted. Therefore the transfer device 200 has at least one or more optically transparent regions to enable such alignment. The optically transparent regions may be formed through the use of an optically transparent material, e.g., glass, being used to form the transfer device 200, or through the use of another material that facilitates optical alignment. In further examples, the transfer device 200c may comprise one or more holes that act as viewing ports. Such holes are optionally formed by etching the transfer device wafer 202 and or layer 212 using physical or chemical means.

Whilst the transfer device is preferably optically aligned, in alternative examples, other alignment methods that provide the necessary accuracy of alignment can be used.

When the features 206a, 206b, 206c, 206d with holes 204a, 204b, 204c, 204d are brought into contact with the bonding pads 108a, 108b, 108c, 108d of the source wafer 100, the peripheries of the features 206a, 206b, 206c, 206d with holes 204a, 204b, 204c, 204d form seals on the surface of the bonding pads 108a, 108b, 108c, 108d respectively, effectively to seal the holes 204a, 204b, 204c, 204d and channel structure 210 from the surrounding environment at the holes 204a, 204b, 204c, 204d. Once the features 206a, 206b, 206c, 206d with holes 204a, 204b, 204c, 204d of the transfer device 202 are brought into contact with the bonding pads 108a, 108b, 108c, 108d (such as the bonding pad 108 described with reference to FIGS. 7 to 9) and peripheral seals have been formed, the vacuum source is switched on at central communication point 208 thereby evacuating the channel structure and holes 204a, 204b, 204c, 204d, hence creating a pressure differential. The pressure differential results in temporary bonds being formed between the transfer device 200c and the components of the source device (for example at the bonding pads 108a, 108b, 108c, 108d, as shown at FIG. 11B).

Whilst the process is described with reference to the pressure differential preferably being created once the source wafer and the transfer wafer 202 are in contact, alternatively the pressure differential may be created prior to contacting the wafers.

When the transfer device 200c is separated from the source wafer 100 using the means for moving and/or aligning the transfer device, for example the alignment means of a wafer bonding tool, the force created by the temporary bond formed by the pressure differential created between the evacuated channel structure 210, holes 204a, 204b, 204c, 204d and the surrounding environment, is sufficient to overcome the force retaining the bonding pads 108a, 108b, 108c, 108d to the layer 106a of the source wafer 100 at the attachment points. The attachment points 110 break and the bonding pads 108a, 108b, 108c, 108d and accompanying cantilevers and tips 112 are selectively removed from the source wafer 100.

Figure 11B:
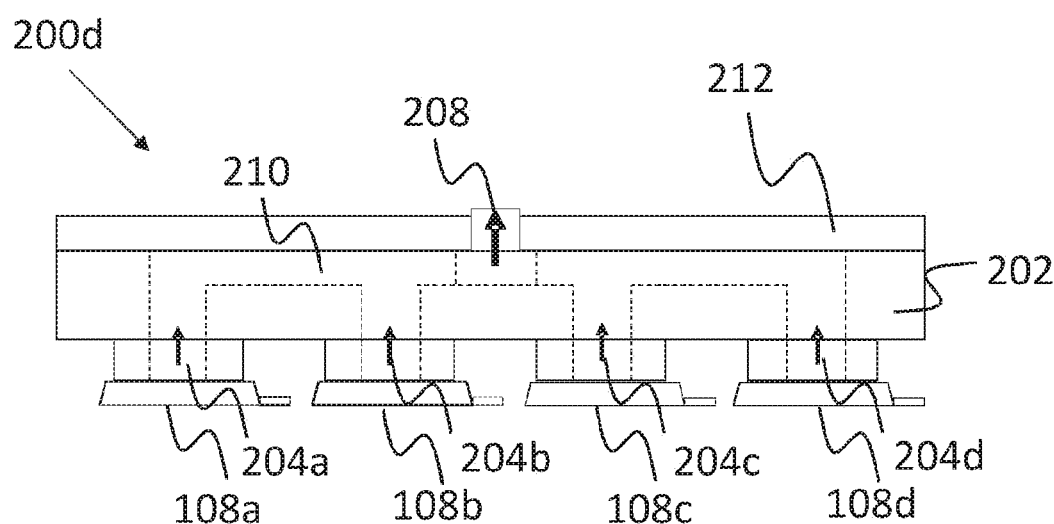
FIG. 11B is a cross-sectional view of the transfer device of FIG. 11A with components temporarily bonded to the transfer device.

FIG. 11B shows a cross-sectional view 200d of the transfer device 200a, 200b, 200c when components have been extracted from a source wafer, such as a source wafer 100 described with reference to FIGS. 7 to 9. Accordingly, components, including bonding pads 108a, 108b, 108c, 108d are shown to be temporarily bonded to the transfer device 200c. The components are temporarily bonded to the transfer device 200c at the holes 204a, 204b, 204c, 204d that pass through the features 206a, 206b, 206c, 206d when a pressure differential is created by evacuating the channel structure 210 and hence the holes 204a, 204b, 204c, 204d.

The components are then transferred, using the transfer device 200c and associated movement/alignment means, to a host wafer. The components are positioned using the same alignment means that facilitated the extraction of components from the source wafer, in place on the host wafer. The components are then permanently bonded to the respective handling portions on a host wafer. Then the transfer device 200c and the components are decoupled. The decoupling of the transfer device 200c is performed by switching off the active vacuum source that is used to evacuate the channel structure 210 and hence the holes 204a, 204b, 204c, 204d. The components are then detached from the transfer device 200c and the transfer device 200c and the components are separated. The transfer device 200c is reused to repeat the transfer of components from the source wafer to host wafers in the manner described above.

The transfer wafer 202 is an etched wafer (which may be a silicon wafer, or a glass wafer) that is suitably patterned and etched to provide features 206a, 206b, 206c, 206d and cavities holes 204a, 204b, 204c, 204d, from the bulk wafer, that are suitable for selectively removing and transferring components from a source device to a host device. However, alternatively, the features 206a, 206b, 206c, 206d can be provided on the surface of the transfer device by patterning a surface of a wafer, for example a polymer surface. The use of polymer structures may improve the mechanism for selectively removing components from source wafers and transferring them to host wafers since they provide improved conformability to create a peripheral seal around the edge of the holes 204a, 204b, 204c, 204d that are used to create a pressure differential are provided. For example, if the surface of the device has contaminants, a polymer structure fabricated from the same bulk material as the transfer device 202 may encompass the contaminants and still maintain the necessary seal. Alternatively, a polymer coating can be used over the features 206a, 206b, 206c, 206d of a transfer device wafer 202, or on the surface that is to be brought into contact with source and host devices. Examples of polymers that can be used in conjunction with the transfer device wafer 202 include, but are not limited to: photoresists such as SU-8, Polydimethylsiloxane (PDMS), parylene, etc.

Whilst the features 206a, 206b, 206c, 206d described above are preferably etched from a single wafer 202, alternatively, in further examples, the features 206a, 206b, 206c, 206d may be formed from separate structures that are combined with the transfer device wafer 202.

Whilst the above examples describe the transfer of a plurality of components from a source wafer to a host wafer in order to provide an assembled device on a host wafer, alternatively, the transfer of components can be from multiple source wafers to a single host wafer, or from a single source wafer to multiple host wafers, or from multiple source wafers to multiple host wafers.

Advantageously, in the example of assembling AFM probes, the method can be used to provide AFM probes with multiple cantilevers and tips from different source wafers. Beneficially, a more efficient method for providing AFM probes with multiple cantilevers and tips means that AFM probes can be manufactured rapidly and still provide multiple functionalities in a single device.

Further, the method provides the means to enable the manufacture of devices with multiple components of different functionalities, or properties, by sequentially removing components from multiple source devices and transferring the components to a single host device. Advantageously, the processes required to develop components of one functionality can be performed efficiently on a single wafer, with a high density. These components can then be combined with components with a different functionality that are efficiently developed on a different single wafer, with high density.

Beneficially, the described methods facilitate the manipulation of components of devices that are too small to be handled with traditional prior art pick-and-place tools. The above-described transfer devices are suitable for transferring components that are less than 200 μm in diameter and preferably less than 150 μm in diameter, including components that are less than 100 μm in diameter. Furthermore, the above-described transfer devices are suitable for transferring components that are less than 20 μm thick, which components are too thin to be manipulated with traditional pick-and-place tools, due to the problems with breaking and shearing described above.

Advantageously, the use of either a passively trapped vacuum, or a continuously pumped vacuum, whereby an evacuated space is partially enclosed by the transfer device and partially by a component, means that a component can be extracted from a source wafer and moved to a host wafer without the need for adhesive to be used in the process. This reduces the chance of residual contamination and extra processing steps to deal with the adhesive. Furthermore, when multiple components are simultaneously extracted from a source device and distributed amongst one or more host devices, the process efficiency for assembling devices can be significantly improved.

Whilst the techniques above are described with respect to the assembly of AFM probes, the principles can be extended to other forms of devices that benefit from the intensive processing of a portion of the device (and/or where the portion of the device is too small or thin to be handled using known techniques) and the parallel assembly of the devices. For example, the techniques are applicable to other semiconductor devices and micro-fabricated devices such as MEMS and sensors. In further examples, the above techniques for assembling a group of devices can be applied to embed complex components in position on a host device, such as silicon cantilever sensors inside polymeric microfluidic channels, for example for medical diagnostic applications. The silicon cantilevers are processed on a source wafer and transferred using a transfer device to the host device which has channels, into which channels the silicon cantilevers are transferred.

The invention claimed is:

1. A method of assembling a group of devices, the method comprising the steps of:
   bringing a first group of two or more components from a source device into contact with a transfer device under a first local pressure in a vacuum chamber, wherein the transfer device comprises a contact surface, a first group of holes formed in the contact surface, and a first group of voids communicating with the first group of holes with each of the holes communicating with a corresponding one of the voids, the first group of holes being located at positions corresponding to the positions of the first group of two or more components from the source device;
   increasing the pressure in the vacuum chamber from the first local pressure to a second local pressure to create a pressure differential between each of the first group of voids of the transfer device and the vacuum chamber, wherein the pressure differential creates a temporary bond between each component of the first group of two or more components and the contact surface of the transfer device and, wherein strength of the temporary bond created by the pressure differential is sufficient to selectively remove the first group of components from the source device responsive to movement of the transfer device;
   selectively removing the first group of two or more components from the source device, within the vacuum chamber, whilst the transfer device is temporarily bonded to each component of the first group of two or more components on the source device;
   positioning, within the vacuum chamber, the first group of two or more components on a host device; and
   decoupling, within the vacuum chamber, the first group of two or more components from the transfer device by reducing the pressure differential to form a first group of assembled devices.

2. The method according to claim 1, wherein each component of the first group of two or more components comprises at least one of an AFM cantilever and an AFM tip, wherein the components of the first group of two or more components are each positioned on a corresponding AFM handling chip on the host device, wherein decoupling the first group of two or more components from the transfer device comprises permanently bonding each component of the first group of two or more components to the corresponding AFM handling chip, thereby to form a group of assembled AFM probes.

3. The method according to claim 1, wherein the method further comprises the steps of:
   bringing a second group of two or more components on either: the source device or a second source device into contact with the transfer device under a local pressure in the vacuum chamber;
   increasing the pressure in the vacuum chamber to create a pressure differential between the space in each of first group of voids of the transfer device and the vacuum chamber, wherein the pressure differential creates a temporary bond between each component of the second group of two or more components and the transfer device;
   selectively removing the second group of two or more components from either: the source device or the second source device, whilst the transfer device is temporarily bonded to each component of the second group of two or more components on either: the source device or the second source device;
   positioning the second group of two or more components on the host device or a second host device; and
   decoupling the second group of two or more components from the transfer device, thereby to form a second group of assembled devices.

4. The method according to claim 3, wherein each component of the second group of two or more components comprises at least one of: an AFM cantilever and/or an AFM tip.

5. The method according to claim 3, wherein method further comprises the steps of:
   positioning the first group of two or more components on the host device;
   positioning the second group of two or more components on the second host device, wherein the host device is different from the second host device; and
   positioning and decoupling the first group of two or more components and the second group of two or more components sequentially from at least one of the source device and the second source device using the transfer device.

6. The method according claim 3, wherein the second group of two or more components and the first group of two or more components from the source device are positioned on the same portion of at least one of the host device and the second host device thereby to form a multi-component device.

7. The method according to claim 1, wherein the method further comprises the step of:
   arranging the components of the first group of two or more components at positions in a first configuration on the source device, wherein the positions in the first configuration correspond to assembly sites at equivalent positions of the first configuration on at least one of the host device and the second host device, thereby to enable the transfer of the first group of two or more components and assembly of the first group of assembled devices in a single step.

8. The method according to claim 7, wherein the method further comprises the step of:
   arranging the components of the second group of two or more components at positions in a second configuration on at least one of the source device and the second source device, wherein the positions in the second configuration on at least one of the source device and/or the second source device correspond to assembly sites at equivalent positions of the second configuration on at least one of the host device and the second host device, thereby to enable the transfer of the second group of two or more components and assembly of the second group of assembled devices in a single step, wherein the method further comprises the step of:

creating the temporary bonds at features at the transfer device, wherein the features of the transfer device correspond to the first configuration and the second configuration, thereby to enable repeat use of the transfer device to assemble the first and second groups of assembled devices.

9. The method according to claim 1, wherein at least one of the source device and the second source device is a wafer and wherein at least one of the source device and/or the second source device comprises at least one semiconductor.

10. The method according to claim 1, wherein the method further comprises the step of:

fabricating the components in situ by processing at least of the source device and the second source device.

11. The method according to claim 1, wherein processing the source device and includes creating attachment points between the source device and the components, wherein the strength of the temporary bonds is sufficient to selectively remove components from the source device by overcoming and breaking the attachment points.

12. The method according to claim 1, wherein each component of the first group of two or more components is a micro-fabricated device.

13. The method according to claim 1, wherein the voids are formed in a patterned surface.

14. The method according to claim 13, wherein:

the patterned surface comprises a plurality of structures having portions extending from a planar surface of the transfer device; and the voids are formed in the portions extending from the planar surface.

15. The method according to claim 13, wherein:

the plurality of structures each comprises a sealable periphery about a corresponding one of the holes; and bringing the transfer device into contact with the source device seals each of the first group of voids formed in the patterned surface.

16. The method according to claim 13, wherein the patterned surface comprises a polymer.

17. The method according to claim 13, wherein the patterned surface is a polymer coating on a wafer.

18. The method according to claim 17, wherein the polymer is a photoresist.

* * * * *